(12) United States Patent
Mitta et al.

(10) Patent No.: US 11,616,163 B2
(45) Date of Patent: Mar. 28, 2023

(54) FIRING FURNACE FOR FIRING ELECTRODE OF SOLAR CELL ELEMENT, METHOD FOR MANUFACTURING SOLAR CELL ELEMENT, AND SOLAR CELL ELEMENT

(71) Applicant: Shin-Etsu Chemical Co., Ltd., Tokyo (JP)

(72) Inventors: Ryo Mitta, Annaka (JP); Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 389 days.

(21) Appl. No.: 15/821,052

(22) Filed: Nov. 22, 2017

(65) Prior Publication Data

US 2018/0108803 A1    Apr. 19, 2018

Related U.S. Application Data

(62) Division of application No. 13/703,261, filed as application No. PCT/JP2011/062755 on Jun. 3, 2011, now abandoned.

(30) Foreign Application Priority Data

Jun. 10, 2010   (JP) .................................. 2010-133084

(51) Int. Cl.
*H01L 31/18* (2006.01)
*F27B 9/24* (2006.01)
(Continued)

(52) U.S. Cl.
CPC .............. *H01L 31/18* (2013.01); *F27B 9/243* (2013.01); *F27B 17/00* (2013.01);
(Continued)

(58) Field of Classification Search
CPC ...... F27B 9/243; F27B 17/00; H01L 21/6776; H01L 31/1864; H01L 31/18; H01L 21/67109
See application file for complete search history.

(56) References Cited

U.S. PATENT DOCUMENTS 3,876,485 A    4/1975  Kinlock et al.
6,251,756 B1 *  6/2001  Horzel .............. H01L 21/67109
                                                   438/510
(Continued)

FOREIGN PATENT DOCUMENTS

JP    06-018178 A    1/1994
JP    08-162446 A    6/1996
(Continued)

OTHER PUBLICATIONS

International Search Report of PCT/JP2011/062755, dated Jul. 12, 2011, w/ English translation.
(Continued)

*Primary Examiner* — Sadie White
(74) *Attorney, Agent, or Firm* — WHDA, LLP

(57) ABSTRACT

Disclosed is a firing furnace for firing an electrode of a solar cell element, which is provided with: a transfer member, which transfers a substrate having a conductive paste applied thereto; a heating section, which heats the substrate and fires the conductive paste; and a cooling section, which cools the heated substrate. The furnace is also provided with a heating means for heating the transfer member. Specifically, at the time of firing the electrode paste using the wire-type firing furnace, since a wire is fired at a temperature substantially equivalent to the ambient temperature of the heating section, deterioration of yield due to having the electrode damaged by a deposited material of the metal component of the conductive paste is suppressed, said (Continued)

deposited material being deposited on the wire, and the wire-type firing furnace can be continuously used.

9 Claims, 3 Drawing Sheets

(51) Int. Cl.
  *H01L 21/67*   (2006.01)
  *H01L 21/677*   (2006.01)
  *H01L 31/0224*   (2006.01)
  *F27B 17/00*   (2006.01)

(52) U.S. Cl.
  CPC .... *H01L 21/6776* (2013.01); *H01L 21/67109* (2013.01); *H01L 31/022425* (2013.01); *H01L 31/1864* (2013.01); *Y02E 10/50* (2013.01); *Y02P 70/50* (2015.11)

(56) References Cited

U.S. PATENT DOCUMENTS

| | | | |
|---|---|---|---|
| 6,501,051 B1* | 12/2002 | Richert | H01L 21/67115 |
| | | | 219/388 |
| 6,512,206 B1 | 1/2003 | McEntire et al. | |
| 7,153,542 B2 | 12/2006 | Nguyen et al. | |
| 8,253,011 B2 | 8/2012 | Ishikawa et al. | |
| 2003/0183491 A1* | 10/2003 | Biro | B65G 25/06 |
| | | | 198/750.2 |
| 2005/0252911 A1 | 11/2005 | Regan | |
| 2007/0169654 A1 | 7/2007 | Baccini et al. | |
| 2008/0012499 A1* | 1/2008 | Ragay | H05B 3/0076 |
| | | | 315/113 |
| 2009/0101199 A1 | 4/2009 | Carroll et al. | |
| 2009/0243111 A1 | 10/2009 | Ishikawa et al. | |
| 2010/0071761 A1* | 3/2010 | Kobamoto | H01L 31/022425 |
| | | | 136/256 |
| 2010/0195992 A1* | 8/2010 | Iwata | B65G 25/02 |
| | | | 392/416 |
| 2010/0267188 A1* | 10/2010 | Parks | F27B 9/20 |
| | | | 438/87 |
| 2010/0300522 A1* | 12/2010 | Ginley | H01L 31/022425 |
| | | | 136/256 |
| 2011/0013892 A1* | 1/2011 | Ragay | H05B 3/0076 |
| | | | 392/411 |
| 2012/0289044 A1 | 11/2012 | Ishikawa et al. | |

FOREIGN PATENT DOCUMENTS

| | | |
|---|---|---|
| JP | 2001-007031 A | 1/2001 |
| JP | 2001-133160 A | 5/2001 |
| JP | 2002-203888 A | 7/2002 |
| JP | 2003-124609 A | 4/2003 |
| JP | 2003-292154 A | 10/2003 |
| JP | 2005-016906 A | 1/2005 |
| JP | 2006-245100 A | 9/2006 |
| JP | 2006-310792 A | 11/2006 |
| JP | 2007-155260 A | 6/2007 |
| JP | 2007-292391 A | 11/2007 |
| JP | 2008-244166 A | 10/2008 |
| JP | 2009-238991 A | 10/2009 |
| TW | 200724838 A | 7/2007 |
| TW | 200830561 A | 7/2008 |

OTHER PUBLICATIONS

Japanese Office Action dated Aug. 13, 2013, issued in corresponding Japanese Patent Application No. 2010-133084.
Taiwanese Office Action dated Nov. 13, 2013, issued in Taiwanese Patent Application No. 100120171 (4 pages).
Written Opinion dated Nov. 19, 2013, issued in corresponding Singaporean application No. 201209044-5 (7 pages).
Search Report dated Nov. 19, 2013, issued in corresponding Singaporean application No. 201209044-5 (6 pages).
Extended European Search Report dated Oct. 22, 2015, issued in counterpart European Patent Application No. 11792355.7 (7 pages).

\* cited by examiner

PRIOR ART FIG.3
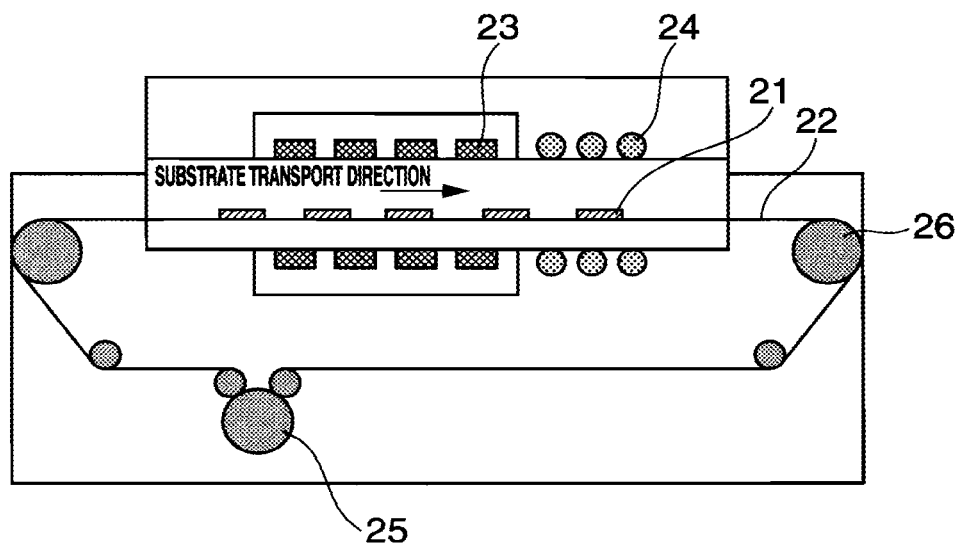
PRIOR ART FIG.4
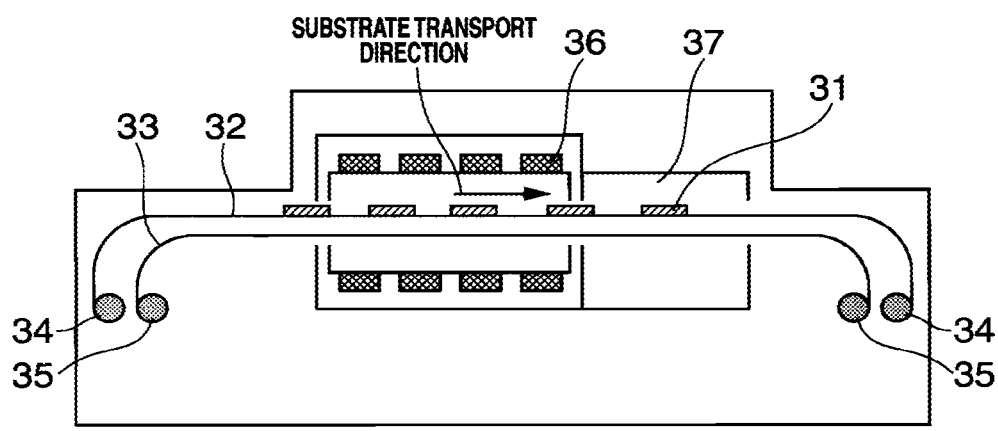

FIRING FURNACE FOR FIRING ELECTRODE OF SOLAR CELL ELEMENT, METHOD FOR MANUFACTURING SOLAR CELL ELEMENT, AND SOLAR CELL ELEMENT

CROSS-REFERENCE TO RELATED APPLICATIONS

This is a divisional of U.S. application Ser. No. 13/703, 261, filed on Feb. 12, 2013, which is a 371 of PCT/JP2011/062755, filed on Jun. 3, 2011, which claims the benefit of priority over Japanese Application No. 2010-133084 filed on Jun. 10, 2010, the entire contents of which are incorporated herein by reference.

TECHNICAL FIELD

This invention relates to a furnace for firing electrodes on a solar cell device, a method for manufacturing a solar cell device using the furnace, and a solar cell device.

BACKGROUND ART

FIG. 1 illustrates in cross section the structure of a typical solar cell device. This solar cell device 1 is manufactured by starting with a p-type semiconductor substrate 2 which is of plate shape having dimensions of 100 to 150 mm squares and a thickness of 0.1 to 0.3 mm and which is based on multicrystalline or monocrystalline silicon and doped with p-type impurity such as boron. The substrate is doped with an n-type impurity such as phosphorus to form an n-type impurity layer 3 and covered with an antireflective coating 4 of SiN or the like. Conductive aluminum paste and conductive silver paste are applied to the back and front surfaces, respectively, by the screen printing method, dried, and fired, whereby an aluminum electrode 5 is formed on the back surface as well as a back surface field (BSF) layer 6, and a collector electrode 7 formed on the front surface.

FIG. 2 schematically illustrates a conventional mesh belt type firing furnace which is utilized in the step of firing conductive pastes to form electrodes in the method of manufacturing the above-mentioned solar cell device. While the substrate 11 having conductive paste printed thereon is transported by a mesh belt 12 which is driven by a drive 15 via rollers 16, the conductive paste is fired in a heating zone 13 and cooled in a cooling zone 14 to form electrodes. Notably, a cleaning tank 17 for removing any contaminants on the mesh belt is illustrated in FIG. 2.

The mesh belt firing furnace suffers from a substantial power consumption because of a large heat capacity of the mesh belt. Also, although a rapid heating/rapid cooling profile is preferred to form a satisfactory BSF layer on the back surface of the solar cell device using aluminum paste, a problem arises that many heaters and water cooling are necessary in order to provide the mesh belt firing furnace with a rapid heating/rapid cooling profile.

To solve these problems, for example, Patent Document 1 (JP-A H08-162446) discloses the use of four wires instead of the mesh belt for thereby reducing the power consumption of the firing furnace and reducing the firing time to increase the throughput. FIG. 3 is a schematic view of this wire type firing furnace. Like the mesh belt type firing furnace, a substrate 21 coated with conductive paste is transported by a wire type transport member 22 which is driven by a drive 25 via rollers 26. As the substrate is passed through heating and cooling zones 23 and 24, electrodes are formed.

In the method of Patent Document 1, the substrate having conductive paste printed thereon is transported by the wires with the substrate rested directly on the wires. In the heating zone of the firing furnace, however, the temperature of wires is generally about 50° C. lower than the atmosphere temperature and the substrate temperature. When the substrate is fired with the front surface faced up, that is, with the aluminum layer on the back surface kept in contact with the wires, aluminum once melted is left on the wires at the contacts due to the temperature difference between the aluminum layer and the wires in the heating zone of the firing furnace, building up on the wires. Such aluminum buildup becomes hard alumina, which can cause flaws to the aluminum electrode as the number of substrates subject to firing treatment increases. Sometimes, such flaws become hard bosses, at which cells can be cracked when cells are stacked for packaging. This gives rise to a problem that the yield of manufacture is reduced.

The method of Patent Document 1 also has the problem that in the event of firing with the back surface faced up, that is, with the silver electrode on the front surface kept in contact with the wires, marks of the wires are left on the silver electrode upon firing, which can cause disconnection and hence, degradations of performance and manufacture yield.

A further problem arises in the method of Patent Document 1. Since the temperature of the wires is lower than the atmosphere and substrate in the heating zone of the firing furnace, the portions of the substrate in contact with the wires are underheated, which can cause under-sintering of silver electrode and a thickness distribution of BSF layer. As a result, the performance of the solar cell device is degraded.

Also a firing furnace using wires as walking beams is known from Patent Document 2 (JP-A 2009-238991). FIG. 4 is a schematic view of the wire type walking beam conveyor firing furnace. This walking beam type firing furnace includes two stationary wires (or fixed beams) 32 extended parallel and horizontal, and movable wires (vertically/transversely movable beams) 33 which can be driven in vertical and transverse directions over predetermined strokes for transporting the substrate 31. These fixed beams 32 and movable beams 33 are fixedly secured by winding on rolls 34 and 35, respectively, while they can be contracted or expanded as necessary. The firing furnace further comprises a heating zone 36 for heating the substrate and a cooling zone 37 for cooling the heated substrate. FIG. 5 is a partial enlarged view of fixed beams 32 and movable beams 33.

In the heating method using walking beams as shown in FIGS. 4 and 5, the substrate 31 is first rested on the fixed beams 32. Then the movable beams 33 which are located below the fixed beams 32 are vertically moved upward to pick up the substrate 31 rested on the fixed beams 32, further moved upward with the substrate 31 rested on the movable beams 33, and stopped at the upper limit of stroke. FIG. 6 illustrates that the substrate 31 is rested on the movable beams 33. Subsequently, the movable beams 33 having the substrate 31 held thereon are advanced one stroke and stopped. Next, the movable beams 33 are vertically moved downward to deliver the substrate 31 to the fixed beams 32, further moved downward, retracted one stroke, and stopped, resuming the original position. In this way, the substrate is heat treated by operating walking beams to convey the substrate through the heating and cooling zones of the furnace.

A changeover from the belt conveyor system to the walking beam conveyor system enables a space saving of a unit necessary for cooling to produce a rapid heating/rapid cooling firing profile suitable to form a satisfactory BSF layer, and offers the advantages of reduced power consumption and shorter treating time. This method, however, inevitably suffers from degradations of performance and manufacture yield of solar cell devices since the substrate comes in direct contact with wires as well.

CITATION LIST

Patent Document

Patent Document 1: JP-A H08-162446
Patent Document 2: JP-A 2009-238991

SUMMARY OF INVENTION

Technical Problem

An object of the invention, which has been made under the above-mentioned circumstances, is to provide a furnace for firing solar cell device electrodes, which ensures effective firing of conductive paste to form an electrode on a substrate by preventing a metal component in the conductive paste from building up on transport members such as wires to cause damages to the electrode or substrate and by minimizing firing variations within the substrate plane, and thus enables to manufacture a solar cell device in high yields without any loss of solar cell performance; a method for manufacturing a solar cell device using the firing furnace; and a solar cell device.

Solution to Problem

Making extensive investigations to attain the above object, the inventors have found that when a furnace for firing solar cell device electrodes, comprising a transport member for transporting a substrate having a conductive paste applied thereto, a heating zone for heating the substrate to fire the conductive paste, and a cooling zone for cooling the heated substrate is used, and particularly when the transport member is of wire structure, and the wire transport member is heated by a heating means, so that the temperature of the transport member may approach to the temperature of the heating zone atmosphere during firing of the electrode paste, the substrate can be effectively heated. This prevents a metal component in the conductive paste from remaining on the wire after melting, thus prevents the buildup of the metal component from causing damages to the electrode or substrate, and minimizes firing variations within the substrate plane. It is then possible to fire the electrode paste in the manufacture of a solar cell device without any losses of solar cell performance and yield. The invention is predicated on these findings.

Accordingly, the invention provides a firing furnace, a method for manufacturing a solar cell device, and a solar cell device, as defined below.
(1) A furnace for firing electrodes on a solar cell device, comprising a transport member for transporting a substrate having a conductive paste applied thereto, a heating zone for heating the substrate to fire the conductive paste, and a cooling zone for cooling the heated substrate, the furnace further comprising a means for heating the transport member.
(2) The firing furnace of (1) wherein the temperature difference between the heating zone atmosphere and the transport member is 0 to 200° C.
(3) The firing furnace of (1) or (2) wherein the transport member comprises at least two wires extended for parallel and horizontal motion in a longitudinal direction of the furnace wherein the substrate is transported by the wires while it is rested thereon.
(4) The firing furnace of any one of (1) to (3) wherein the transport member is of the walking beam system.
(5) The firing furnace of any one of (1) to (4) wherein the means for heating the transport member is an electrical means.
(6) A method for manufacturing a solar cell device, comprising the steps of forming a pn junction in a semiconductor substrate, applying a conductive paste to a light-receiving surface and non-light-receiving surface of the semiconductor substrate, and firing the conductive paste to form power-extracting electrodes, the step of firing the conductive paste being performed in the firing furnace of any one of (1) to (5).
(7) A solar cell device obtained by the method of (6).

Advantageous Effects of Invention

The invention intends that the wire temperature approach to the temperature of the heating zone atmosphere or the temperature of aluminum paste layer, particularly when a wire firing furnace is used in the firing of electrode paste. The wire is heated at a temperature about 50° C. higher than the normal temperature so that the wire temperature is substantially equal to the temperature of the heating zone atmosphere, prior to firing. This prevents a lowering of yield by damaging of the electrode by the buildup on wires of the metal component in the conductive paste, and enables continuous operation of the wire firing furnace. This further minimizes firing variations within the substrate plane which are otherwise caused by the lower temperature of the wire, thus suppressing any loss of performance. Also the furnace provides a high throughput as compared with mesh belt firing furnaces and the like.

BRIEF DESCRIPTION OF DRAWINGS

FIG. 3 is a schematic view of one exemplary wire type firing furnace.
FIG. 4 is a schematic view of one exemplary wire type walking beam firing furnace.

DESCRIPTION OF EMBODIMENTS

Embodiments of the invention are described below in detail. However, the scope of the invention is not limited to the illustrated embodiments because the invention can be implemented in a wide variety of embodiments in addition to the illustrated embodiments. The drawings are not depicted to scale. Certain members are depicted in enlarged scale in order to clarify the description and understanding of the invention whereas insignificant parts are not depicted.

The firing furnace of the invention is intended for firing electrodes on a solar cell device and defined as comprising a transport member for transporting a substrate having a conductive paste applied thereto, a heating zone for heating the substrate to fire the conductive paste, and a cooling zone for cooling the heated substrate, and characterized by further comprising a means for heating the transport member.

Figure 5:
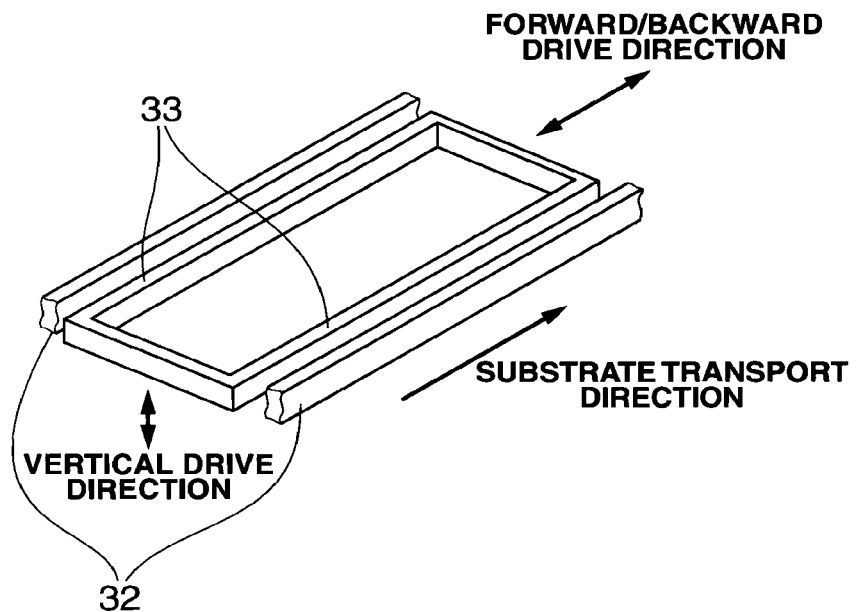
FIG. 5 is a partial enlarged view of fixed and movable beams in the wire type walking beam firing furnace.
Figure 6:
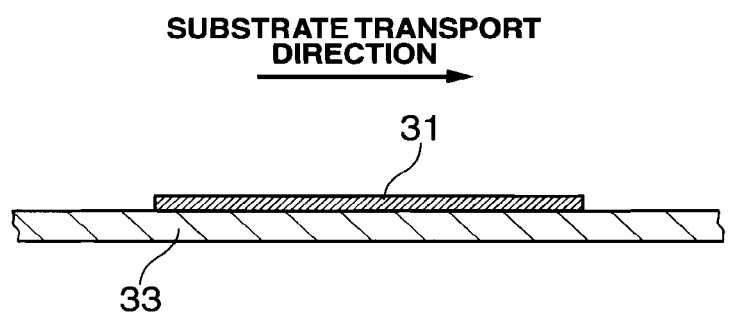
FIG. 6 is a schematic cross-sectional view of a movable beam having a substrate rested thereon.

In the firing furnace of the invention, the substrate having a conductive paste applied thereto is rested on the transport member and transported through the furnace thereby. As the substrate is passed through the heating zone, the conductive paste is fired to form an electrode. The structure of the transport member for transporting the substrate is not particularly limited, and may be any of mesh, wire and other systems. Preference is given to a wire firing furnace wherein wires are used to convey the substrate. The wire firing furnace enables firing at low power consumption and high throughputs as compared with conventional mesh belt firing furnaces.

Where the wire transport member is used, its structure is not particularly limited, and it may have any of prior art well-known structures. Preferred are a structure wherein at least two wires, typically two to four wires are extended for parallel and horizontal motion in a longitudinal direction of the furnace and driven by a drive via rollers as shown in FIG. 3, and a structure wherein at least two wires, typically two to four wires are extended parallel and horizontally in a longitudinal direction of the furnace and movable with necessary as shown in FIG. 4. The wires used herein are preferably made of stainless steel such as SUS303 or SUS304 and also preferably have a diameter of 1 to 20 mm for a balance of wire strength and power consumption necessary to heat the firing furnace. While a wire has a heat capacity dependent on its diameter, the heat capacity is preferably predetermined so that the power consumption necessary to heat the firing furnace may be low. The use of a wire type walking beam as shown in FIGS. 4 to 6, for example, is advantageous because only a low power consumption is necessary to heat the firing furnace.

In firing the electrode paste according to the invention, the transport member having the substrate rested thereon is heated until the temperature of the transport member becomes substantially equal to the temperature of the heating zone atmosphere. In the event of a wire firing furnace using a wire transport member, for example, the wire as the transport member is preheated such that the temperature of the wire is substantially equal to the temperature of the conductive paste layer on the substrate in the firing furnace. The lack of the temperature difference between the wire and the substrate eliminates a conventionally recognized phenomenon that a conductive metal component in the hot conductive paste sticks to a cold wire, and eventually prevents the metal component from building up on the wire. This suppresses a lowering of yield by damaging of the electrode by the buildup of the metal component on the wire, even when the wire firing furnace is continuously operated. This also minimizes firing variations within the substrate plane caused by the low temperature of the wire, thus preventing degradation of the performance.

The means for heating the transport member include an electrical means of directly heating the wire by applying a voltage across the wire to conduct AC or DC current flow. Suitable means of indirectly heating the wire include a means of lamp heating the wire itself by providing a heating area outside the firing furnace; a means of heating the wire itself by applying steam to the wire outside the firing furnace; and a means of heating the wire itself by winding a coil around the wire and conducting electric flow to the coil. Any of these means may be employed for heating the wire. Of these, however, the means of directly heating the wire is superior from the aspects of cost and space because the means of indirectly heating the wire requires provision of a heating area outside the firing furnace. Accordingly, the means of directly heating the wire is preferably selected. Use of such heating means eliminates the temperature difference between the wire and the entire substrate and eliminates a conventionally recognized phenomenon that hot conductive paste sticks to a cold wire, and eventually prevents the metal component in the conductive paste from building up on the wire. This suppresses a lowering of yield by damaging of the electrode by the buildup of the metal component on the wire and also inhibits degradation of the performance due to firing variations within the substrate plane.

The temperature (firing temperature) of the heating zone is typically 500 to 950° C., preferably 600 to 850° C., and the heating time is preferably 5 to 30 seconds. Also preferably the temperature of the cooling zone is 25 to 500° C., and the cooling time is 5 to 30 seconds. The atmosphere in the furnace may be air. Preferred is an atmosphere which allows an organic material in the conductive paste to be burnt off. On the other hand, the temperature of the transport member is substantially equal to the temperature of the heating zone atmosphere, preferably in the range of 500 to 950° C., and more preferably in the range of 600 to 850° C. As used herein, the phrase that "the temperature of the transport member is substantially equal to the temperature of the heating zone atmosphere" means that the temperature difference between the transport member and the heating zone atmosphere is in a range of 0 to 200° C., preferably 0 to 100° C., more preferably 0 to 20° C., and even more preferably 0 to 10° C.

Figure 1:
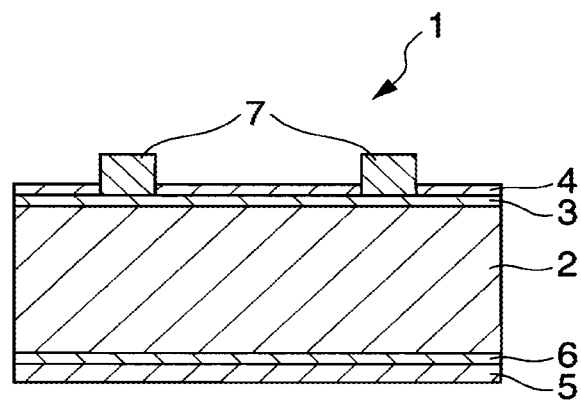
FIG. 1 is a schematic cross-sectional view showing the structure of a typical solar cell device.
Figure 2:
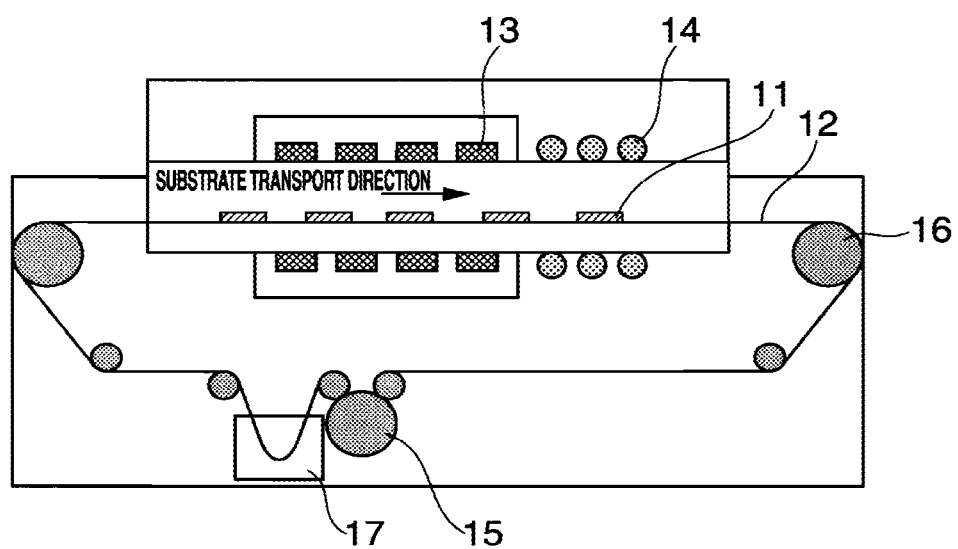
FIG. 2 is a schematic view of an exemplary mesh belt firing furnace.

Next, the solar cell device which is manufactured by the method using the firing furnace of the invention is described. As shown in FIG. 1, for example, the solar cell device 1 includes a silicon substrate 2 as the base, an n-type diffusion layer 3, an antireflective coating 4 of SiN or the like thereon, and a surface collector electrode 7 connected to the n-type diffusion layer on the front surface (light-receiving surface) of substrate 2, as well as a back electrode 5 and a back surface field (BSF) layer 6 on the back surface of substrate 2.

Described below is the method of manufacturing a solar cell device according to the invention. First a substrate, typically p-type silicon substrate is provided. The p-type silicon substrate used often has a resistivity of 0.1 to 4.0 Ω-cm. It may be either multicrystalline or monocrystalline and is preferably of plate shape having dimensions of 100 to 150 mm squares and a thickness of 0.1 to 0.3 mm, as indicated above. The surface of p-type silicon substrate that corresponds to the light-receiving surface of a solar cell device is provided with a rugged structure known as texture, for example, by immersing in an acidic solution, chemically etching in alkaline solution, cleaning, and drying. The rugged structure induces multiple reflections of light at the light-receiving surface of a solar cell device. Therefore, by forming a rugged structure, effective reflectance is reduced, and conversion efficiency is improved. Hereinafter, one surface of p-type silicon substrate serving as the light-receiving surface of a solar cell device is referred to as front surface, and the other surface of p-type silicon substrate opposite to the light-receiving surface is referred to as back surface.

Next, the p-type silicon substrate is placed in a hot gas containing $POCl_3$, for example, at about 800° C. or higher, followed by a thermal diffusion method of diffusing n-type impurity such as phosphorus into the p-type silicon substrate over its entire surface, thereby forming an n-type diffusion layer (n-type impurity layer) in the surface. It is noted that when the n-type diffusion layer is formed by thermal diffusion, the n-type diffusion layers may be formed on opposite surfaces and end surfaces of a p-type silicon substrate. In this case, unnecessary n-type diffusion layers may be removed by immersing the p-type silicon substrate, in which the surface of the necessary n-type diffusion layer is covered with an acid resistant resin, in fluoronitric acid solution or the like. The above procedure results in a substrate having a pn junction.

Next, an antireflective coating of SiN or the like is formed on the surface of the p-type silicon substrate, for example, by a plasma-enhanced CVD method using ammonia, silane, nitrogen, hydrogen or the like.

On the back surface of the substrate, a conductive paste containing aluminum, glass frit, varnish and the like, for example, is screen printed and dried. On the front surface, a conductive paste containing silver, glass frit, varnish and the like, for example, is screen printed and dried to form a collector electrode. Thereafter, the pastes for the respective electrodes are fired in the firing furnace of the invention, whereby an aluminum electrode and a BSF layer are formed on the back surface and a silver electrode formed on the front surface. The shape of the power-extracting electrodes on the front and back surfaces is not particularly limited, and electrodes of any desired shape like comb or grating-shape can be fired in the furnace of the invention. The firing conditions are as alluded previously.

EXAMPLES

Examples and Comparative Examples are given below for further illustrating the invention, but the invention is not limited thereto.

Example and Comparative Example

A p-type silicon substrate of boron-doped p-type multicrystalline silicon which had been sliced to a thickness of 0.2 mm and had a resistivity of about 1 Ω-cm was machined along the outer periphery into a square plate of 15 cm per side. The p-type silicon substrate was immersed in fluoronitric acid solution for 15 seconds for etching the damaged layer, chemically etched for 5 minutes in a solution containing 2 wt % KOH and 2 wt % isopropyl alcohol (IPA) at 70° C., washed with deionized water, and dried, whereby a texture was formed on the surface of the p-type silicon substrate.

Next, the p-type silicon substrate was placed in a $POCl_3$ gas atmosphere and subjected to thermal diffusion at a temperature of 870° C. for 30 minutes, thereby forming an n-type layer on the p-type silicon substrate. The n-type layer had a sheet resistance of about 40 ohm/square (Ω/□). An acid resistant resin was coated on the n-type layer, after which the p-type silicon substrate was immersed in fluoronitric acid solution for 10 seconds to remove the n-type layer where the acid resistant resin coating was absent. Thereafter, the acid resistant resin coating was removed, obtaining a p-type silicon substrate having an n-type layer only on the front surface.

Subsequently, by a plasma-enhanced CVD method using ammonia gas, silane and nitrogen gas, an antireflective coating of SiN was deposited to a thickness of 100 nm on the n-type layer-bearing surface of the p-type silicon substrate. Next, on the back surface of the antireflective coating-bearing substrate, a conductive aluminum paste was printed and dried at 150° C. Thereafter, on the front surface, a conductive silver paste was applied by a screen printing technique and dried at 150° C. to form a collector electrode.

Subsequently, the substrate as treated thus far was admitted into a wire type walking beam firing furnace as shown in FIG. 4 where the conductive pastes were fired at a maximum temperature of 800° C. into electrodes. At this point, electric current was controlledly conducted across the wires so that the temperature of the wires became equal to the temperature of the heating zone atmosphere. The temperature in the firing furnace (heating zone) was measured by inserting a K-series thermocouple (by Keyence Corp.), and the temperature of a wire was measured by placing a K-series thermocouple in contact with the wire. It was confirmed that the temperature of the wires was substantially equal to the temperature of the heating zone atmosphere (wire temperature: 795° C.). This concomitantly eliminated a phenomenon that hot aluminum sticks to a cold wire, in contrast to the event where the wires were not treated by any means, and eventually prevented aluminum from building up on the wires. This avoids a lowering of manufacture yield caused by damaging of aluminum electrode by the buildup of aluminum on the wire, and also avoids a lowering of manufacture yield caused by a phenomenon that when substrates with an aluminum electrode having flaws in the form of bosses are stacked, the substrates can be broken at the bosses. In addition, electrode paste firing variations within the substrate plane due to low temperature of wires are minimized, whereby the distribution of resistance and BSF can be reduced for preventing a drop of conversion efficiency. Furthermore, the lifetime of the module can be extended by restraining acceleration of degradation-with-age of the solar cell initiated from flaws in the aluminum electrode.

By firing according to the above procedure, 1,000 solar cell devices were manufactured. Table 1 reports the performance of the solar cell devices and the yield after the firing step. The yield is a pass rate of those substrates devoid of the above-indicated problems (crack, boss, appearance anomaly) relative to the number of substrates admitted to the firing step.

In contrast, the data of Comparative Example are those of solar cell devices which were fired in the same wire firing furnace as in Example, without heating the wires. The temperature in the firing furnace (heating zone) was measured by inserting a K-series thermocouple, and the temperature of a wire was measured by placing a K-series thermocouple in contact with the wire. It was confirmed that the temperature of the wires was about 50° C. lower than the temperature of the heating zone atmosphere. As seen from Table 1, improvements in solar cell performance and manufacture yield are expectable from the use of the firing furnace of the invention, as compared with the firing step of Comparative Example. These improvements are mainly attributable to the elimination of a temperature drop of the wires.

TABLE 1

|  | Yield (%) | Conversion efficiency (%) |
| --- | --- | --- |
| Example | 97.7 | 14.9 |
| Comparative Example | 95.4 | 14.8 |

REFERENCE SIGNS LIST

1: solar cell device
2: substrate

3: n-type impurity layer
4: antireflective coating
5: back surface electrode
6: BSF layer
7: front surface collector electrode
11, 21, 31: substrate
12: mesh belt
13, 23, 36: heating zone
14, 24, 37: cooling zone
34, 35: roll
15, 25: drive
16, 26: roller
17: cleaning tank
22: wire transport member
32: fixed wire (fixed beam)
33: movable wire (movable beam)

The invention claimed is:

1. A method for manufacturing a solar cell device, comprising the steps of forming a pn junction in a semiconductor substrate, applying a conductive paste to a light-receiving surface and non-light-receiving surface of the semiconductor substrate, and firing the conductive paste to form power-extracting electrodes,
wherein:
the step of firing the conductive paste is performed in a firing furnace comprising a heating zone for heating the substrate having the conductive paste applied thereto, a cooling zone for cooling the heated substrate, and a transport member having a structure wherein two to four wires are extended parallel and horizontally in a longitudinal direction of the heating zone and movable for transporting the substrate having the conductive paste applied thereto through the heating zone with the substrate resting directly on the wires,
the step of firing the conductive paste comprises bringing a temperature of an atmosphere of the heating zone to a firing temperature of 500 to 950° C. and firing the conductive paste at the firing temperature for 5 to 30 seconds,
the substrate having the conductive paste applied thereto is transported by the wires in the longitudinal direction of the heating zone with the substrate resting directly on the wires to pass through the heating zone where the conductive paste is fired,
the method further comprises a step of pre-heating the wires to a temperature substantially equal to the temperature of the heating zone atmosphere, so that when the wires are further heated in the heating zone, a temperature difference between the heating zone atmosphere and the wires is in a range of 0 to 20° C. in the heating zone, and
the wires are pre-heated by applying a voltage directly across the wires to conduct AC or DC current flow.

2. The method of claim 1, wherein the wires are made of stainless steel.

3. The method of claim 1, wherein the wires are of a walking beam.

4. The method of claim 1, wherein means for preheating the wires preheats the wires to compensate for the temperature of the wires in the heating zone becoming lower than the heating zone atmosphere temperature in the case of no preheating.

5. The method of claim 1, wherein means for preheating the wires preheats the wires at a temperature about 50° C. higher than a temperature of the wires without the preheating.

6. The method of claim 1, wherein the firing temperature of the heating zone is 600 to 850° C.

7. The method of claim 1, wherein the conductive paste applied to the non-light-receiving surface of the semiconductor substrate is a conductive aluminum paste, and an aluminum electrode and a back surface field (BSF) layer are formed on the non-light-receiving surface by firing.

8. The method of claim 1, wherein the wires have a diameter of 1 to 20 mm.

9. The method of claim 1, wherein the substrate has a thickness of 0.1 to 0.3 mm.

* * * * *